US012699115B2

(12) United States Patent
Rizzardini et al.

(10) Patent No.: US 12,699,115 B2
(45) Date of Patent: Aug. 4, 2026

(54) ELECTROSTATIC CHARGE VARIATION BASED POWER FAILURE DETECTION

(71) Applicant: STMicroelectronics International N.V., Geneva (CH)

(72) Inventors: Federico Rizzardini, Settimo Milanese (IT); Lorenzo Bracco, Chivasso (IT)

(73) Assignee: STMicroelectronics International N.V., Geneva (CH)

( * ) Notice: Subject to any disclaimer, the term of this patent is extended or adjusted under 35 U.S.C. 154(b) by 231 days.

(21) Appl. No.: 18/603,001

(22) Filed: Mar. 12, 2024

(65) Prior Publication Data

US 2025/0290955 A1 Sep. 18, 2025

(51) Int. Cl.
*G01R 15/16* (2006.01)

(52) U.S. Cl.
CPC .................................. *G01R 15/165* (2013.01)

(58) Field of Classification Search
CPC ...... G01R 1/067; G01R 1/06788; G01R 1/26; G01R 3/00; G01R 11/04; G01R 31/69
See application file for complete search history.

(56) References Cited

U.S. PATENT DOCUMENTS

2010/0169031 A1* 7/2010 Dishman ................... G06F 1/28
307/66
2014/0232516 A1 8/2014 Stivoric et al.

| | | | |
|---|---|---|---|
| 2016/0267754 A1* | 9/2016 | Hickman | ............. G01R 19/155 |
| 2016/0342781 A1 | 11/2016 | Jeon | |
| 2019/0128939 A1 | 5/2019 | O'Donnell et al. | |
| 2021/0072318 A1 | 3/2021 | Park et al. | |
| 2022/0225003 A1 | 7/2022 | Alessi et al. | |
| 2023/0236234 A1 | 7/2023 | Passaniti et al. | |
| 2023/0349300 A1 | 11/2023 | Seto et al. | |
| 2024/0155506 A1* | 5/2024 | Palally | ................ H04W 52/246 |

FOREIGN PATENT DOCUMENTS

| | | |
|---|---|---|
| EP | 2980609 A1 | 2/2016 |
| KR | 20110061750 A | 6/2011 |

OTHER PUBLICATIONS

Zahid, "Contact Less Power Failure Alarm using NE555 IC," Circuits DIY, https://www.circuits-diy.com/contact-less-mains-power-failure-alarm/, May 1, 2021. (7 pages).

* cited by examiner

*Primary Examiner* — Tung X Nguyen
(74) *Attorney, Agent, or Firm* — Seed Intellectual Property Law Group LLP

(57) ABSTRACT

The present disclosure is directed to devices and methods for performing power failure detection. A power failure is detected using an electrostatic charge variation sensor that measures variation of electrostatic charge in a surrounding environment. Power failure is detected wirelessly and without being directly connected to the power network. Further, the electrostatic charge variation sensor has low power consumption and allows for customization of detection sensitivity.

18 Claims, 7 Drawing Sheets

ELECTROSTATIC CHARGE VARIATION BASED POWER FAILURE DETECTION

BACKGROUND

Technical Field

The present disclosure is directed to power failure detection for electronic devices.

Description of the Related Art

Power failure or outage detection is used to alert a user that an electronic device is no longer receiving power and, consequently, not functioning properly. Power failure detection is used for various electronic devices in which operation is critical. For example, power failure detection is often used to detect proper operation of refrigerators, freezers, security systems, water or gas leak detectors, etc. Power failure detection may also be used for commercial purposes, such as data centers, distribution centers, and storage facilities, to ensure various systems are working as intended. It is important for power failures to be detected promptly and without the need of human supervision in order to avoid costs due to damage.

Current power failure detection systems are typically directly connected to the power network itself, and detect power failure when power is no longer being received. There are also some contactless power failure detection solutions but such solutions typically utilize high input voltage with high current consumption and are not easily tunable without modifying the hardware itself.

BRIEF SUMMARY

The present disclosure is directed to devices and methods for performing power failure detection. A power failure is detected using an electrostatic charge variation sensor that measures variation of electrostatic charge in a surrounding environment.

In one embodiment, an electrostatic charge variation measurement signal is filtered with a high pass filter. An envelope of the filtered electrostatic charge variation measurement signal is then compared to a threshold value. A power failure is detected in case the envelope drops below the threshold value. No power failure is detected in case the envelope rises above the threshold value. The threshold value is dynamically determined based on the envelope of the filtered electrostatic charge variation measurement signal.

In one embodiment, an electrostatic charge variation measurement signal is filtered with a high pass filter. An absolute value of the filtered electrostatic charge variation measurement signal is then filtered again with a band pass filter. The band pass filtered signal is then compared to an upper threshold value and a lower threshold value. A power failure is detected in case the band pass filtered signal drops below the lower threshold value. No power failure is detected in case the band pass filtered signal rises above the upper threshold value. The upper and lower threshold values are dynamically determined based on the band pass filtered signal.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures, functions, and methods of manufacturing electronic devices, electronic components, and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As discussed above, current power failure detection systems are typically directly connected to the power network itself. Further, contactless power failure detection solutions typically utilize high input voltage with high current consumption, and are not easily tunable without modifying the hardware itself.

The present disclosure is directed to devices and methods for performing power failure detection with an electrostatic charge variation sensor. The electrostatic charge variation sensor is an electrical potential sensor able to measure the variation of quasi-electrostatic potential. Power failure is detected without being directly connected to the power network, and with low power consumption. In addition, the power failure detection may be easily customized and adjusted depending on the application without modifying the hardware itself.

Figure 1:
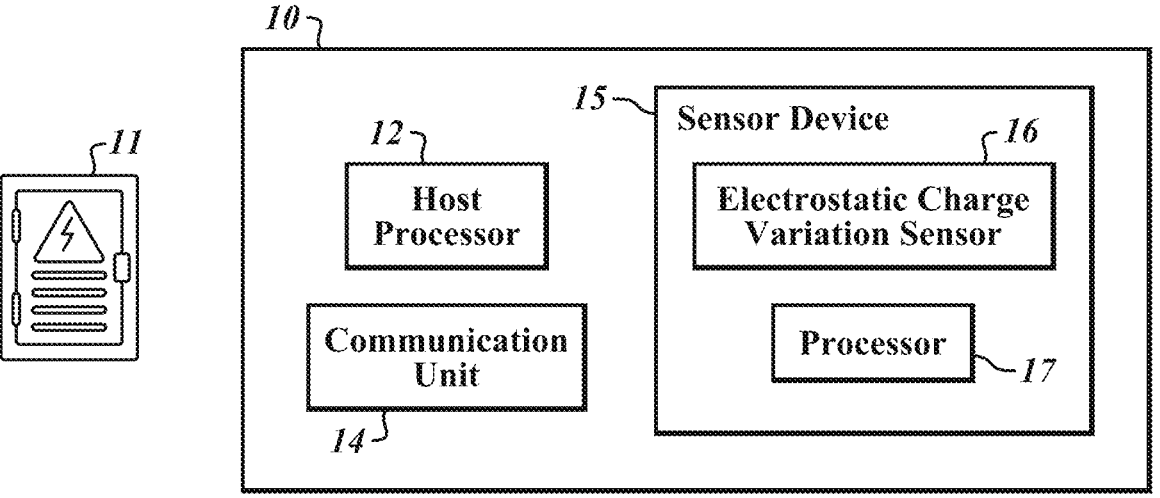
FIG. 1 is a block diagram of a device configured to detect power failure according to an embodiment disclosed herein.

FIG. 1 is a block diagram of a device 10 configured to detect power failure according to an embodiment disclosed herein. The device 10 is designed to be placed in close proximity to a power network, more specifically an alternating current (AC) power line 11 (e.g., the power outlet of the AC power line 11), into which a target device (e.g., a refrigerator, freezer, security system, water or gas leak detector, etc.) that is monitored for power failure is plugged. In one embodiment, the device 10 is a portable, battery powered device and not directly connected to the power network.

The device 10 includes a host processor 12, a communication unit 14, and a sensor device 15. The device 10 may include other components, such as an alarm.

The host processor 12 is a host general-purpose processor that performs various functions for the device 10. For example, the host processor 12 executes various applications, controls and coordinates hardware components of the device 10, and communicates with any peripheral devices communicatively coupled to the device 10. The host processor 12 may be any type of processor, controller, or microcontroller that is able to process data. The host processor 12 may include one or more processors.

The communication unit 14 is communicatively coupled to the host processor 12 and the sensor device 15. The communication unit 14 is configured to transmit and receive data. For example, the communication unit 14 transmits an alert to a user in response to a power failure being detected. As another example, the communication unit 14 receives configuration data, such as various parameters (e.g., a parameter n discussed in further detail below), for customizing the power failure detection. The communication unit 14 may be any type of transceiver and may utilize various communication technologies, such as Bluetooth, Bluetooth Low Energy, Wi-Fi, LoRa, broadband cellular network technologies, etc.

The sensor device 15 is communicatively coupled to the host processor 12 and the communication unit 14. The sensor device 15 includes an electrostatic charge variation sensor 16 and a processor 17. The sensor device 15 may also include other sensors, such as motion sensors, proximity sensors, and thermal sensors.

The electrostatic charge variation sensor 16 measures variation of electrostatic charge (i.e., a change in electrostatic charge) in a surrounding environment received by one or more input electrodes. The electrostatic charge variation sensor 16 provides the electrostatic charge variation measurement signal to the processor 17.

Figure 2:
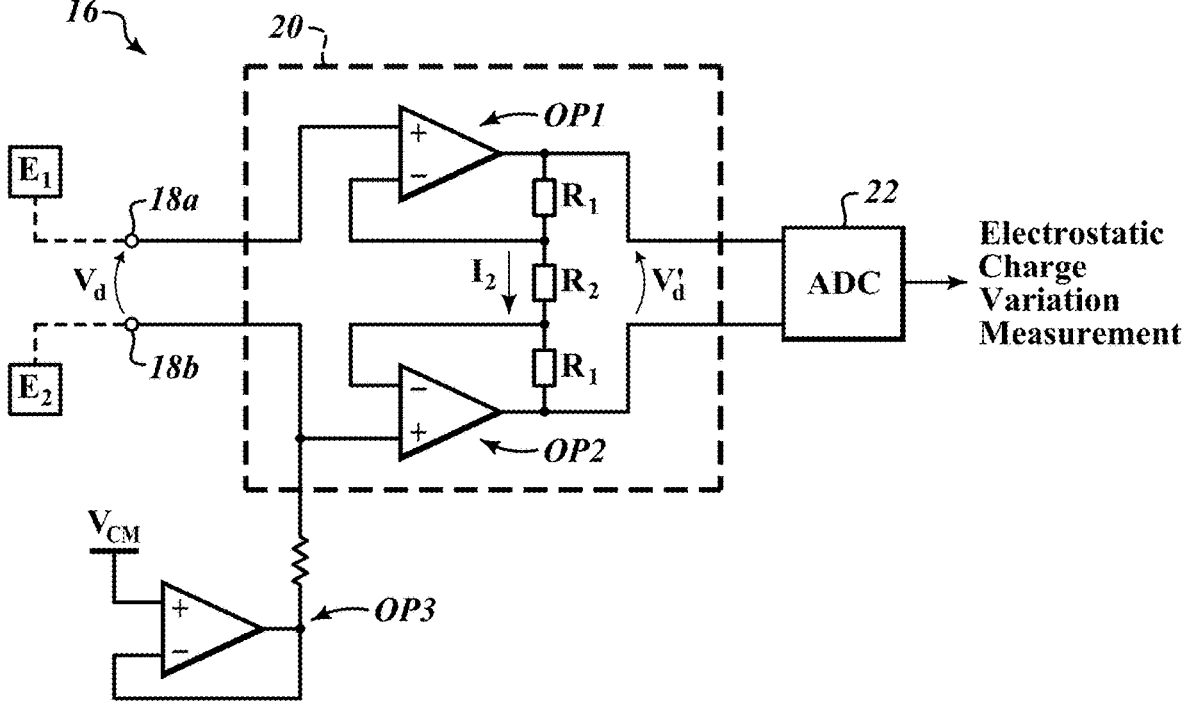
FIG. 2 is a circuit diagram of an electrostatic charge variation sensor according to an embodiment disclosed herein.

The electrostatic charge variation sensor 16 includes various electronic components (e.g., capacitors, resistors, amplifiers, etc.) to measure electrostatic charge variation. For example, FIG. 2 is a circuit diagram of the electrostatic charge variation sensor 16 according to an embodiment disclosed herein.

The electrostatic charge variation sensor 16 includes a pair of input terminals 18a, 18b, coupled to input electrodes $E_1$, $E_2$, respectively. Each of the electrodes $E_1$, $E_2$ is made of conductive material and, in one embodiment, coated with an insulating layer. The electrodes $E_1$, $E_2$ act as antennas and receive electrostatic charge variations.

The geometry of the electrodes $E_1$, $E_2$ determines the sensitivity and directivity of the electrostatic charge variation sensor 16. The sensitivity is proportional to the surface area of the electrodes $E_1$, $E_2$. The shape of the electrodes $E_1$, $E_2$ and their positioning in space affects the directivity of the electrostatic charge variation sensor 16.

In one embodiment, the electrodes $E_1$, $E_2$ are positioned inside of the device 10. In another embodiment, the electrodes $E_1$, $E_2$ are positioned on one or more exposed surfaces of the device 10 such that the electrodes $E_1$, $E_2$ are exposed to a surrounding environment. For example, the electrodes $E_1$, $E_2$ may be positioned on different side surfaces of the device 10.

The pair of input terminals 18a, 18b receive, from the respective electrodes $E_1$, $E_2$, an input voltage $V_d$ (a differential signal), and supply the input voltage $V_d$ to an instrumentation amplifier 20. As will be discussed in further detail below, a presence of an indoor alternating current (AC) power line generates a variation of electrostatic charge which, in turn, after having been detected by the electrodes $E_1$, $E_2$, generates the input voltage $V_d$.

The instrumentation amplifier 20 includes operational amplifiers OP1, OP2 and a biasing stage (buffer) OP3. The biasing stage OP3 biases the instrumentation amplifier 20 to a common mode voltage $V_{CM}$.

An inverting terminal of the amplifier OP1 is electrically connected to an inverting terminal of the amplifier OP2 through a resistor $R_2$ across which there is a voltage equal to the input voltage $V_d$. Therefore, a current equal to $I_2$ will flow through this resistor $R_2$. The current $I_2$ does not come from the input terminals of the operational amplifiers OP1, OP2, and, therefore, runs through two resistors $R_1$ connected between the outputs of the operational amplifiers OP1, OP2, in series with the resistor $R_2$. The current $I_2$, which runs through the series of the three resistors $R_1$-$R_2$-$R_1$, produces a differential output voltage $V_d'$.

The differential output voltage $V_d'$, therefore being proportional to the potential $V_d$ between the input terminals 18a, 18b, is input to an analog-to-digital converter (ADC) 22, which outputs a charge variation signal. The charge variation signal is, for example, a high-resolution digital stream (e.g., 16 bits or 24 bits). The charge variation signal is an electrostatic charge variation measurement of a change in electrostatic charge in a surrounding environment.

In another embodiment, the instrumentation amplifier 20 is omitted, so that the ADC 22 receives the differential output voltage $V_d$ between the electrodes $E_1$, $E_2$ and samples the differential output voltage $V_d$ directly. In another embodiment, the ADC 22 is omitted, and the charge variation signal is the differential output voltage $V_d$.

In the embodiment shown in FIG. 2, the electrostatic charge variation sensor 16 includes two electrodes. However, the electrostatic charge variation sensor 16 may include any number of electrodes. In one embodiment, electrode $E_2$ is disconnected and electrostatic charge variation is received by just the electrode $E_1$.

Returning to FIG. 1, the processor 17 is configured to receive and process data generated by the electrostatic charge variation sensor 16, and execute programs (e.g., a finite state machine, machine learning algorithms, etc.) stored in an onboard memory of the sensor device 15. As will be discussed in further detail below, the processor 17 is configured for power failure detection. The processor 17 may include one or more processors.

In contrast to a general-purpose processor like the host processor 12, the processor 17 is a power-efficient, low-powered device processor that consumes between, for example, 10 and 100 microamperes for computational requirements during processing. As such, the sensor device 15 may be always on to perform power failure detection without risk of draining the battery of the device 10. As a result, power failure detection results may always be obtained.

Figure 3:
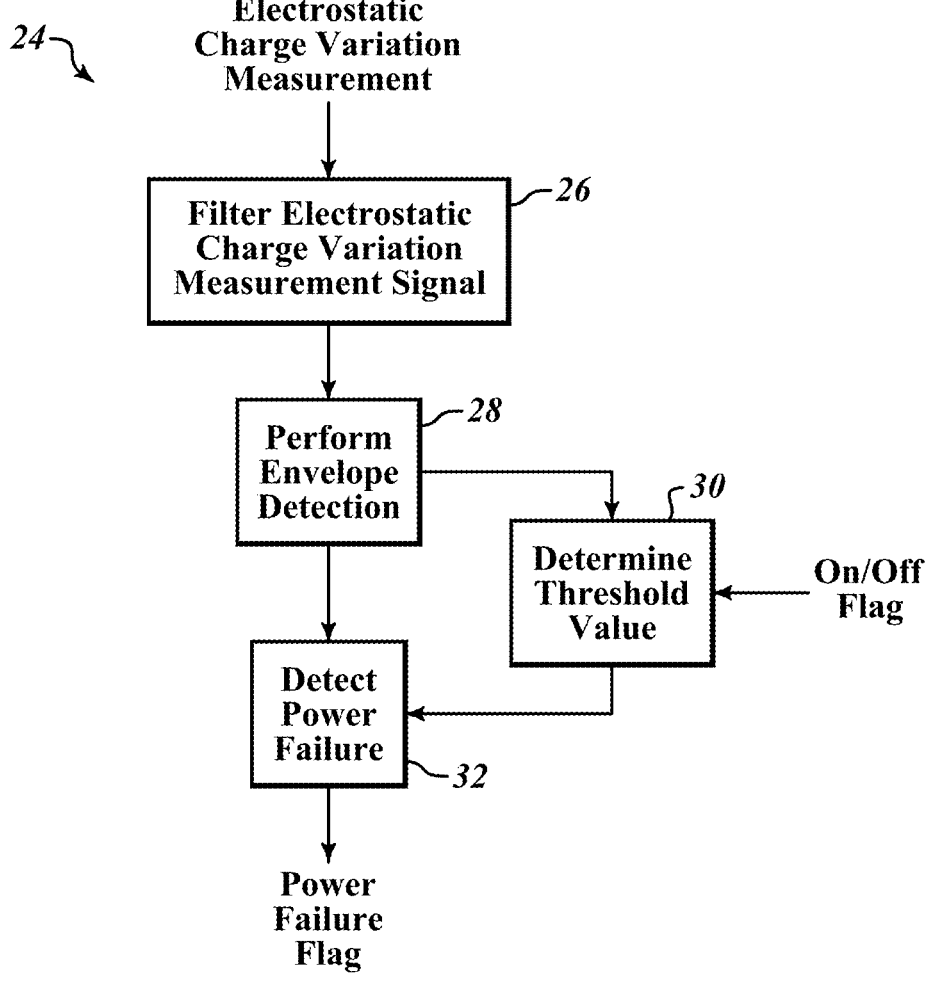
FIG. 3 is a flow diagram of a method of detecting power failure according to an embodiment disclosed herein.

FIG. 3 is a flow diagram of a method 24 of detecting power failure according to an embodiment disclosed herein. The method 24 detects power failure by sensing amplitude changes of the AC power line 11.

The method 24 is executed by the device 10. More specifically, the method 24 is implemented as a program or a set of instructions that is downloaded and stored in the onboard memory included in the sensor device 15, and is executed by the processor 17 included in the sensor device 15. As such, power failure detection may be performed in the sensor device 15 hardware itself without host intervention. However, it is also possible for the program for the method 24 to be stored in memory of the device 10, and executed by the host processor 12 of the device 10.

In block 26, the electrostatic charge variation sensor 16 generates an electrostatic charge variation measurement signal, and provides the electrostatic charge variation measurement signal to the processor 17. The electrostatic charge variation measurement signal indicates amplitude changes of the AC power line 11. The processor 17 subsequently filters the electrostatic charge variation measurement signal to remove unnecessary components from the signal. In one embodiment, the processor 17 applies a high pass filter in order to remove any offset in the electrostatic charge variation measurement signal and low frequency components of the electrostatic charge variation measurement signal. In one embodiment, the high pass filter has a cutoff between 0.1 and 10 hertz.

Figure 4A:
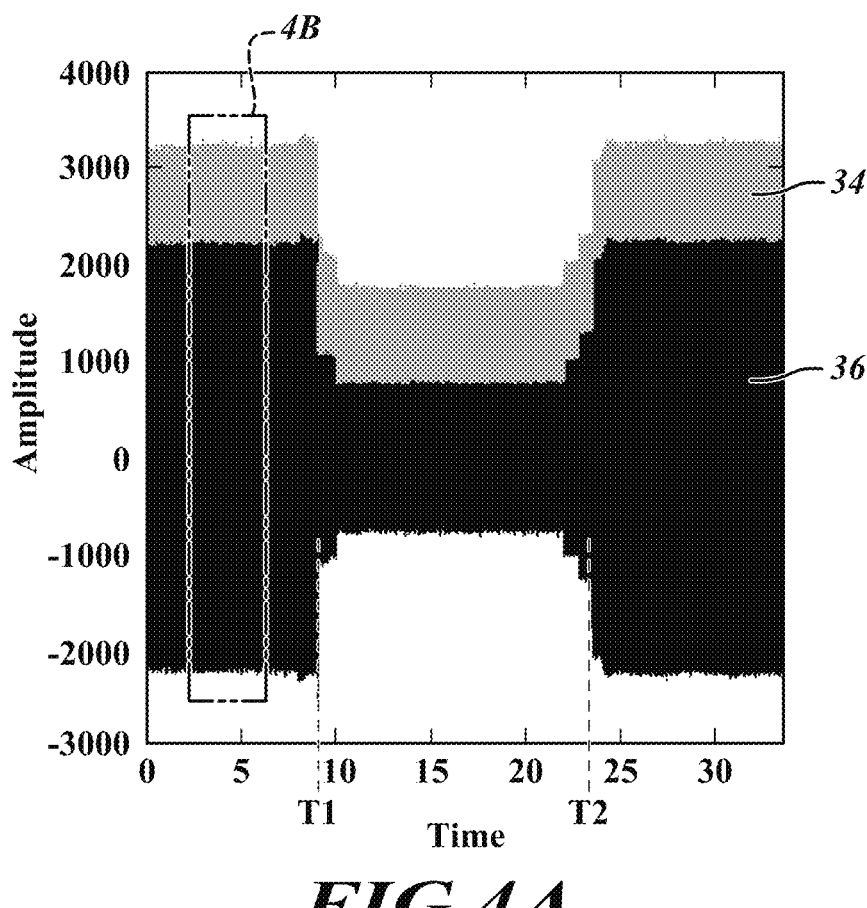
FIG. 4A is an electrostatic charge variation measurement signal and a filtered electrostatic charge variation measurement signal according to an embodiment disclosed herein.
Figure 4B:
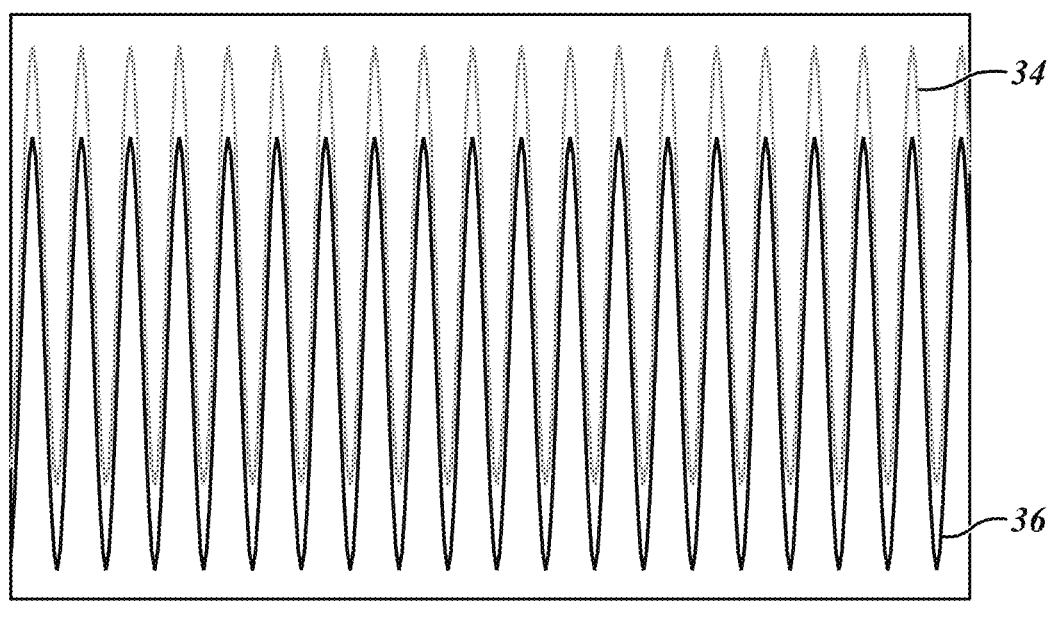
FIG. 4B is an enlarged view of an electrostatic charge variation measurement signal and a filtered electrostatic charge variation measurement signal according to an embodiment disclosed herein.

For example, FIG. 4A shows an electrostatic charge variation measurement signal 34 and a filtered electrostatic charge variation measurement signal 36 according to an embodiment disclosed herein. FIG. 4B is an enlarged view of the electrostatic charge variation measurement signal 34 and the filtered electrostatic charge variation measurement signal 36 according to an embodiment disclosed herein.

The vertical axis is an amplitude axis of electrostatic charge variation and the horizontal axis is a time axis. The amplitudes are, for example, outputs from the ADC 22 discussed above with respect to FIG. 2. The time is, for example, in seconds. Other amplitude and time units are also possible.

The electrostatic charge variation measurement signal 34 is generated by the electrostatic charge variation sensor 16 and indicates variation of electrostatic charge in a surrounding environment. As best shown in the enlarged view in FIG. 4B, the electrostatic charge variation measurement signal 34 is a sinusoidal signal. The frequency of the sinusoidal signal corresponds to the frequency of the AC power line 11. For example, in FIGS. 4A and 4B, the electrostatic charge variation measurement signal 34 has a frequency of 50 hertz corresponding to the frequency of an AC power line in Italy. Detection of AC power lines with other frequencies (e.g., 60 hertz) is also possible.

When the device 10, more specifically the electrostatic charge variation sensor 16, is near an active AC power line (e.g., the AC power line is in an on state and supplying power to the target device), electrostatic charge variation measurements are strongly amplified. Conversely, when the device 10 is near an inactive AC power line (e.g., the AC power line is in an off state and not supplying power to the target device), electrostatic charge variation measurements are reduced. For example, in FIG. 4A, the device 10 is positioned near an AC power line. The AC power line is active prior to time T1, inactive between time T1 and time T2, and returns to active after time T2.

The filtered electrostatic charge variation measurement signal 36 is the electrostatic charge variation measurement signal 34 filtered with a high pass filter. As a result, the offset and low frequency components of the electrostatic charge variation measurement signal 34 are removed.

Returning to FIG. 3, in block 28, the processor 17 performs envelope detection on the filtered electrostatic charge variation measurement signal from block 26. The envelope detection generates an envelope signal of the filtered electrostatic charge variation measurement signal that follows the maximums or peaks of the filtered electrostatic charge variation measurement signal. Stated differently, the envelope signal is an upper envelope that outlines the maximums of the filtered electrostatic charge variation measurement signal. In one embodiment, the envelope detection is implemented through a recursive (i.e., iteratively updated) maximum feature that follows the maximum and decays for new values lower than the maximum.

Figure 5A:
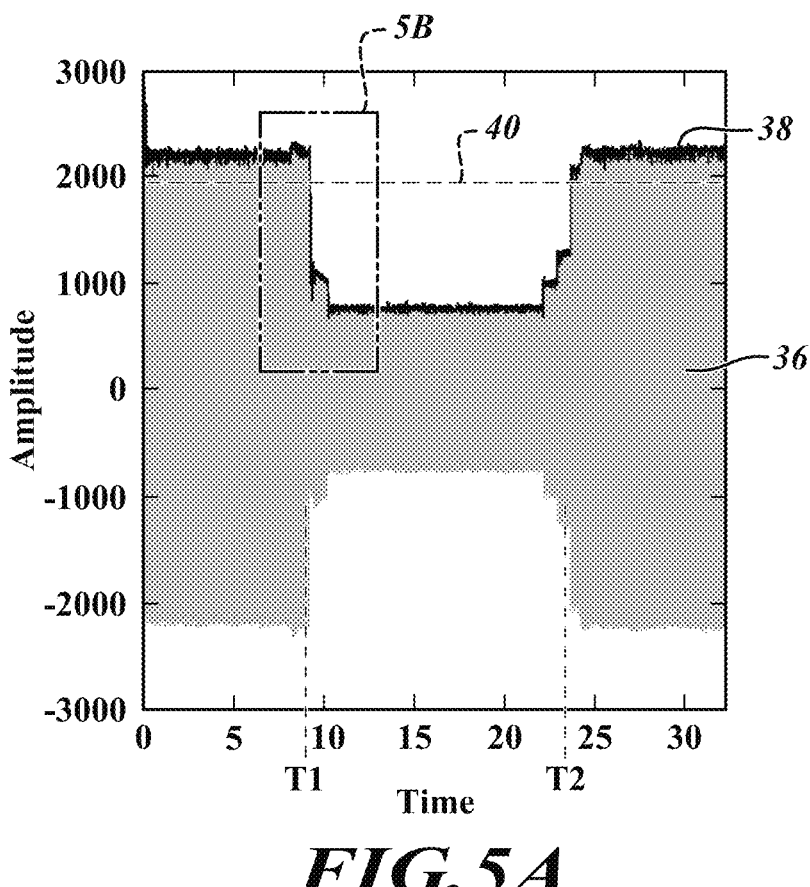
FIG. 5A is a filtered electrostatic charge variation measurement signal and an envelope signal according to an embodiment disclosed herein.
Figure 5B:
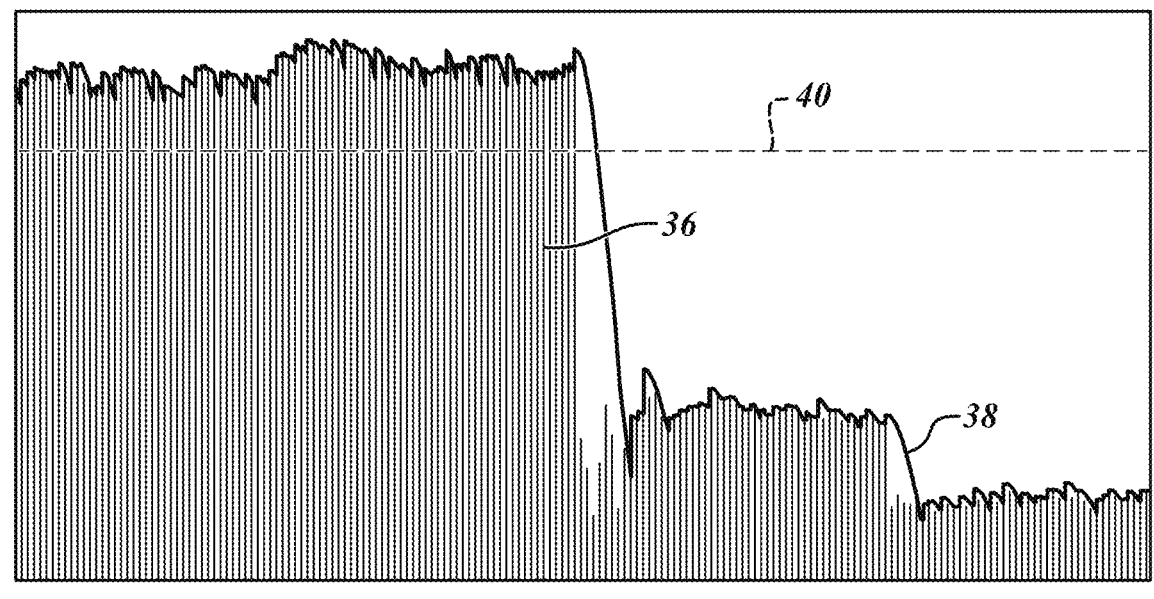
FIG. 5B is an enlarged view of a filtered electrostatic charge variation measurement signal and an envelope signal according to an embodiment disclosed herein.

For example, FIG. 5A shows the filtered electrostatic charge variation measurement signal 36 and an envelope signal 38 according to an embodiment disclosed herein. FIG. 5B is an enlarged view of the filtered electrostatic charge variation measurement signal 36 and the envelope signal 38 according to an embodiment disclosed herein.

As discussed with respect to FIGS. 4A and 4B, the vertical axis is an amplitude axis of electrostatic charge variation and the horizontal axis is a time axis. The filtered electrostatic charge variation measurement signal 36 is the electrostatic charge variation measurement signal 34 filtered with a high pass filter.

As can be seen in FIGS. 5A and 5B, the envelope signal 38 is an upper envelope that follows the maximums or peaks of the filtered electrostatic charge variation measurement signal 36.

Returning to FIG. 3, in block 30, a threshold value for power failure detection is determined. In one embodiment, the threshold value is determined by the processor 17 of the sensor device 15. In one embodiment, the threshold value is determined by the host processor 12, and the host processor 12 transmits the threshold value to the processor 17 for power failure detection.

The threshold value is a threshold by which power failure is determined. For example, it is determined that the AC power line 11 is active (e.g., the AC power line 11 is in an on state and supplying power to the target device) in case the envelope signal is greater than or equal to the threshold value, and inactive (e.g., the AC power line 11 is in an off state and not supplying power to the target device) in case the envelope signal is less than the threshold value.

The threshold value is determined based on the envelope signal determined in block 28. In one embodiment, the threshold value is equal to a difference between a mean u and a standard deviation o of the envelope signal when the AC power line 11 is active and supplying power to the target device (e.g., prior to time T2 or after time T2 in FIG. 5A). More specifically, the threshold value is calculated using Equation (1) when the AC power line 11 is active:

$$\text{Threshold Value} = \mu - n * \sigma \qquad (1)$$

where μ is the mean of the envelope signal, σ is the standard deviation of the envelope signal, and n is a parameter or value used to adjust a sensitivity of the power failure detection. In one embodiment, the parameter n is received from a user through the communication unit 14.

In one embodiment, the determination of the threshold value in block 30 is set to an on state or an off state. For example, the host processor 12 is instructed by a user to set the determination to the on state or the off state. In the on state, the threshold value is actively determined based on the envelope signal determined in block 28. As a result, the threshold value is adapted to the envelope signal in real time. In the off state, the threshold value is not being determined. In this case, the last determined threshold value or a default threshold value is used for power failure detection. In one embodiment, the determination of the threshold value in block 30 is set to an on state periodically, upon request, or when the device 10 is first installed next to the AC power line 11.

In block 32, the processor 17 detects a power failure based on the envelope signal determined in block 28 and the threshold value determined in block 30.

In one embodiment, the processor 17 determines whether or not the envelope signal is greater than the threshold value. The processor 17 detects no power failure (e.g., the AC power line 11 is in an on state and supplying power to the target device) in case the envelope signal is greater than or equal to the threshold value, and, in response, sets a power failure flag to indicate that a power failure has not occurred (e.g., a bit equal to zero). Conversely, the processor 17 detects a power failure (e.g., the AC power line 11 is in an off state and not supplying power to the target device) in case the envelope signal is less than the threshold value, and, in response, sets a power failure flag to indicate that a power failure has occurred (e.g., a bit equal to one).

As an example, referring to FIG. 5A, the processor 17 determines the envelope signal 38 is greater than or equal to a threshold value 40 prior to time T1 and after time T2, and, as such, detects no power failure prior to time T1 and after time T2. Conversely, the processor 17 determines the envelope signal 38 is less than the threshold value 40 between time T1 and time T2, and, as such, detects power failure between time T1 and time T2.

In case the processor 17 detects a power failure, the processor 17 also tracks a time in which the power failure has occurred and a time duration of the power failure. The host processor 12 also takes one or more action in response to a power failure being detected. For example, the host processor 12 instructs the communication unit 14 to transmit an alert to a user or sounds an alarm in response to a power failure being detected.

Figure 6:
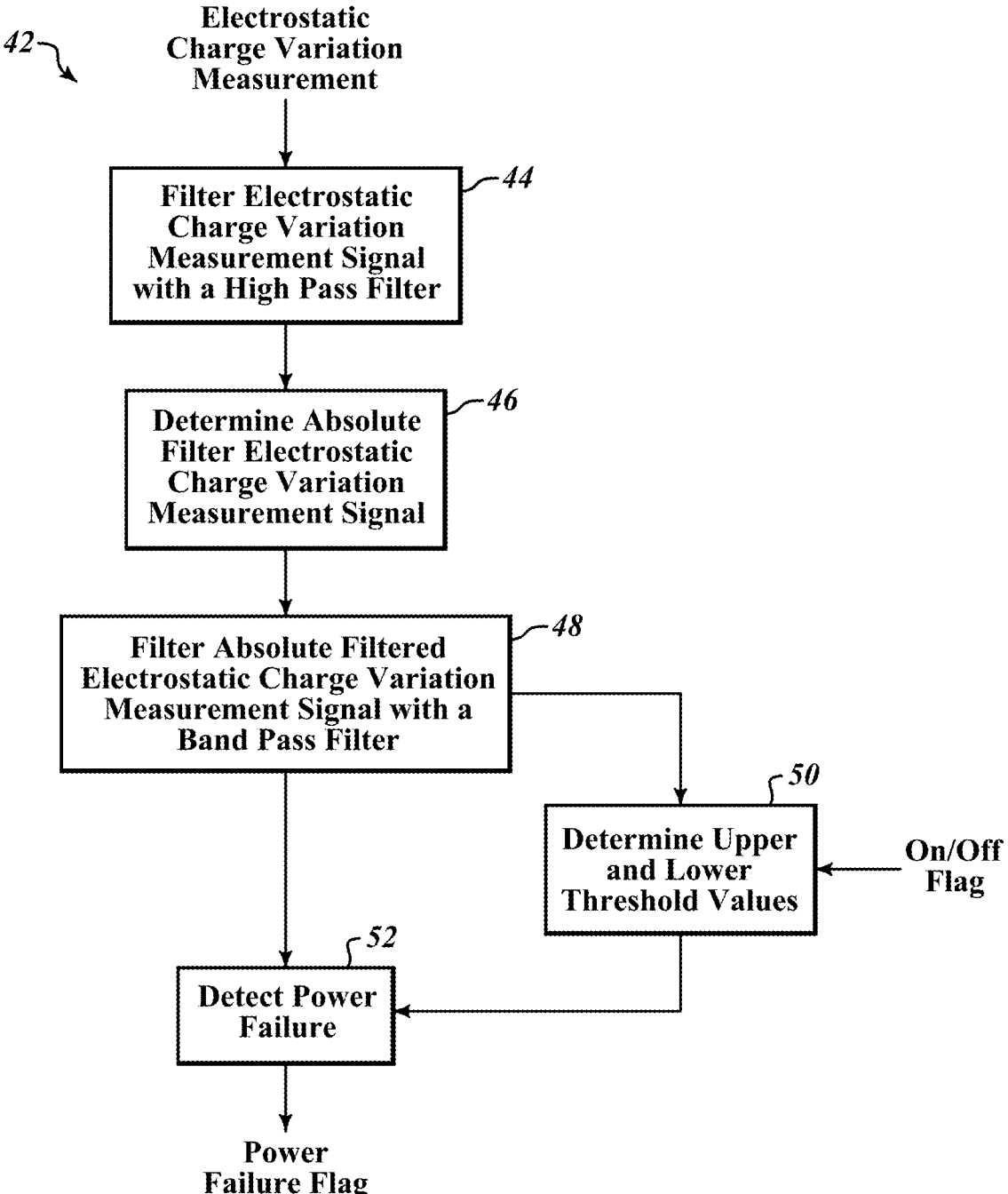
FIG. 6 is a flow diagram of a method of detecting power failure according to another embodiment disclosed herein.

FIG. 6 is a flow diagram of a method 42 of detecting power failure according to another embodiment disclosed herein. Similar to the method 24 of FIG. 3, the method 42 detects power failure by sensing amplitude changes of the AC power line 11.

The method 42 is executed by the device 10. More specifically, the method 42 is implemented as a program or a set of instructions that is downloaded and stored in the onboard memory included in the sensor device 15, and is executed by the processor 17 included in the sensor device 15. As such, power failure detection may be performed in the sensor device 15 hardware itself without host intervention. However, it is also possible for the program for the method 42 to be stored in memory of the device 10, and executed by the host processor 12 of the device 10.

Similar to block 26, in block 44, the electrostatic charge variation sensor 16 generates an electrostatic charge variation measurement signal, and provides the electrostatic charge variation measurement signal to the processor 17.

The processor 17 subsequently filters the electrostatic charge variation measurement signal to remove unnecessary components from the signal. In particular, the processor 17 applies a high pass filter in order to remove any offset in the electrostatic charge variation measurement signal and low frequency components of the electrostatic charge variation measurement signal. In one embodiment, the high pass filter has a cutoff between 0.1 and 10 hertz.

For example, FIGS. 4A and 4B, as discussed above, show an electrostatic charge variation measurement signal 34 and a filtered electrostatic charge variation measurement signal 36.

In block 46, the processor 17 determines an absolute filtered electrostatic charge variation measurement signal. The absolute filtered electrostatic charge variation measurement signal is the absolute value of the filtered electrostatic charge variation measurement signal from block 44. As such, the absolute filtered electrostatic charge variation measurement is the filtered electrostatic charge variation measurement signal with the sign removed.

Figure 7:
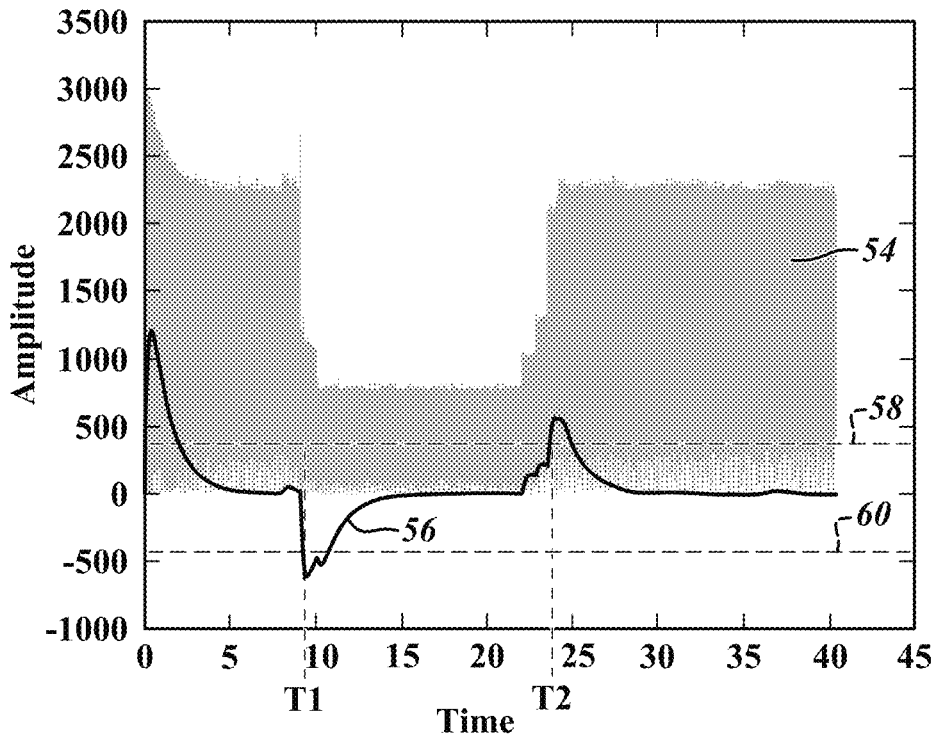
FIG. 7 is an absolute filtered electrostatic charge variation measurement signal and a band pass filtered signal according to an embodiment disclosed herein.

For example, FIG. 7 shows an absolute filtered electrostatic charge variation measurement signal 54 and a band pass filtered signal 56 according to an embodiment disclosed herein.

Similar to FIGS. 4A and 4B, the vertical axis is an amplitude axis of electrostatic charge variation and the horizontal axis is a time axis. The amplitudes are, for example, outputs from the ADC 22 discussed above with respect to FIG. 2. The time is, for example, in seconds. Other amplitude and time units are also possible.

The absolute filtered electrostatic charge variation measurement signal 54 is the absolute value of the filtered electrostatic charge variation measurement signal 36. As can be seen in FIG. 7, the values of the filtered electrostatic charge variation measurement signal 36 are all positive. The band pass filtered signal 56 will be discussed in further detail below.

Returning to FIG. 6, in block 48, the processor 17 generates a band pass filtered signal by filtering the absolute filtered electrostatic charge variation measurement signal from block 46 with a band pass filter. In one embodiment, the band pass filter has a first cut off between 0.05 and 0.15 hertz and a second cutoff between 0.95 and 1.05 hertz. The band pass filter extracts amplitude changes in the absolute filtered electrostatic charge variation measurement signal. A large, negative peak in the band pass filtered signal indicates a large decrease in amplitude in the absolute filtered electrostatic charge variation measurement signal. Conversely, a large, positive peak in the band pass filtered signal indicates a large increase in amplitude in the absolute filtered electrostatic charge variation measurement signal.

For example, as mentioned above, FIG. 7 shows a band pass filtered signal 56. The band pass filtered signal 56 is the absolute filtered electrostatic charge variation measurement signal 54 filtered with a band pass filter. As can be seen in FIG. 7, the band pass filtered signal 56 has a negative peak at time T1 in which the absolute filtered electrostatic charge variation measurement signal 54 decreases in amplitude, and has a positive peak at time T2 in which the absolute filtered electrostatic charge variation measurement signal 54 increases in amplitude. As discussed above with respect to FIG. 4A, the device 10 is positioned near the AC power line 11; and the AC power line 11 is active prior to time T1, inactive between time T1 and time T2, and returns to active after time T2.

Returning to FIG. 6, in block 50, an upper threshold value and a lower threshold value for power failure detection are determined. In one embodiment, the upper and lower threshold values are determined by the processor 17 of the sensor device 15. In one embodiment, the upper and lower threshold values are determined by the host processor 12, and the host processor 12 transmits the upper and lower threshold values to the processor 17 for power failure detection.

The upper and lower threshold values are thresholds by which power failure is determined. For example, it is determined that the AC power line 11 is active (e.g., the AC power line 11 is in an on state and supplying power to the target device) in case the band pass filtered signal is greater than the upper threshold value, and inactive (e.g., the AC power line 11 is in an off state and not supplying power to the target device) in case the band pass filtered signal is less than the lower threshold value. It is determined that the AC power line 11 is in the previously determined state in case the band pass filtered signal is lower than or equal to the upper threshold and greater than or equal to the lower threshold.

The upper and lower threshold values are determined based on the band pass filtered signal determined in block 48.

In one embodiment, the upper threshold value is equal to a sum of a mean u and a standard deviation o of the band pass filtered signal when the AC power line 11 is active and supplying power to the target device (e.g., prior to time T1 or after time T2 in FIG. 7). More specifically, the upper threshold value is calculated using Equation (2) when the AC power line 11 is active:

$$\text{Upper Threshold Value} = \mu + n * \sigma \qquad (2)$$

where $\mu$ is the mean of the band pass filtered signal, $\sigma$ is the standard deviation of the band pass filtered signal, and n is a parameter or value used to adjust a sensitivity of the power failure detection. In one embodiment, the parameter n is received from a user through the communication unit 14.

In one embodiment, the lower threshold value is equal to a difference between a mean $\mu$ and a standard deviation o of the band pass filtered signal when the AC power line 11 is active and supplying power to the target device (e.g., prior to time T1 or after time T2 in FIG. 7). More specifically, the lower threshold value is calculated using Equation (3) when the AC power line 11 is active:

$$\text{Lower Threshold Value} = \mu - n * \sigma \qquad (3)$$

where $\mu$ is the mean of the band pass filtered signal, o is the standard deviation of the band pass filtered signal, and n is a parameter or value used to adjust a sensitivity of the power failure detection. In one embodiment, the parameter n is received from a user through the communication unit 14.

In one embodiment, the determination of the upper and lower threshold values in block 50 is set to an on state or an off state. For example, the host processor 12 is instructed by a user to set the determination to the on state or the off state. In the on state, the upper and lower threshold values are actively determined based on the band pass filtered signal determined in block 48. As a result, the upper and lower threshold values are adapted to the band pass filtered signal in real time. In the off state, the upper and lower threshold values are not being determined. In this case, the last determined upper and lower threshold values or default upper and lower threshold values are used for power failure detection. In one embodiment, the determination of the upper and lower threshold values in block 50 is set to an on state periodically, upon request, or when the device 10 is first installed next to the AC power line 11.

In block 52, the processor 17 detects a power failure based on the band pass filtered signal determined in block 48 and the upper and lower threshold values determined in block 50.

In one embodiment, the processor 17 determines whether the band pass filtered signal is greater than the upper threshold value or lower than the lower threshold value. The processor 17 detects no power failure (e.g., the AC power line 11 is in an on state and supplying power to the target device) in case the band pass filtered signal is greater than the upper threshold value, and, in response, sets a power failure flag to indicate that a power failure has not occurred (e.g., a bit equal to zero). Stated differently, the processor 17 determines the device 10 exits a power failure in case the band pass filtered signal is greater than the upper threshold value. Conversely, the processor 17 detects a power failure (e.g., the AC power line 11 is in an off state and not supplying power to the target device) in case the band pass filtered signal is less than the lower threshold value, and, in response, sets a power failure flag to indicate that a power failure has occurred (e.g., a bit equal to one). Stated differently, the processor 17 determines the device 10 enters a power failure in case the band pass filtered signal is less than the lower threshold value.

As an example, referring to FIG. 7, the processor 17 determines the band pass filtered signal 56 is lower than a lower threshold value 60 at time T1, and, as such, detects power failure at time T1. Conversely, the processor 17 determines the band pass filtered signal 56 is greater than an upper threshold value 58 at time T2, and, as such, detects no power failure at time T2.

In case the processor 17 detects a power failure, the processor 17 also tracks a time in which the power failure has occurred and a time duration of the power failure. The host processor 12 also takes one or more actions in response to a power failure being detected. For example, the host processor 12 instructs the communication unit 14 to transmit an alert to a user or sounds an alarm in response to a power failure being detected.

The various embodiments disclosed herein provide devices and methods for performing power failure detection. A power failure is detected using an electrostatic charge variation sensor that measures variation of electrostatic charge in a surrounding environment. As power failure is detected based on electrostatic charge variation, power failure is detected wirelessly and without being directly connected to the power network. Further, the electrostatic charge variation sensor has low power consumption and allows for detection sensitivity to be easily adjusted.

A device may be summarized as including: a sensor device including: an electrostatic charge variation sensor including an electrode configured to receive a variation of electrostatic charge generated by a power source, the electrostatic charge variation sensor configured to generate an electrostatic charge variation measurement signal of the variation of electrostatic charge; and a processor configured to: detect a power failure of the power source based on the electrostatic charge variation measurement signal and a threshold value; and output a power failure flag in response to the power failure being detected; and a host processor communicatively coupled to the sensor device, the host processor configured to determine the threshold value.

The processor may be configured to: filter the electrostatic charge variation measurement signal with a filter; determine an envelope signal of the filtered electrostatic charge variation measurement signal; and detect the power failure of the power source based on the envelope signal and the threshold value.

The filter may be a high pass filter.

The processor may be configured to detect the power failure of the power source in case an amplitude of the envelope signal is less than the threshold value.

The host processor may be configured to determine the threshold value based on the envelope signal.

The host processor may be configured to determine the threshold value based on a mean and a standard deviation of the envelope signal.

The host processor may be configured to determine the threshold value based on a difference between a mean and a standard deviation of the envelope signal.

The host processor may be configured to: receive an instruction to determine the threshold value; and determine the threshold value in response to the instruction being received.

The host processor may be configured to transmit an alert to a user or sound an alarm in response to the power failure flag being outputted.

The processor may be configured to: filter the electrostatic charge variation measurement signal with a first filter; determine an absolute signal of the filtered electrostatic charge variation measurement signal; filter the absolute signal with a second filter different from the first filter; and detect the power failure of the power source based on the filtered absolute signal and the threshold value.

The first filter may be a high pass filter, and the second filter may be a band pass filter.

The processor may be configured to: detect the power failure of the power source in case an amplitude of the filtered absolute signal is less than the threshold value; and detect no power failure of the power source in case the amplitude of the filtered absolute signal is greater than another threshold value greater than the threshold value.

The host processor may be configured to determine the threshold value and the another threshold value based on the filtered absolute signal.

The host processor may be configured to determine the threshold value based on a difference between a mean and a standard deviation of the filtered absolute signal, and the another threshold value based on a sum of the mean and the standard deviation of the filtered absolute signal.

The host processor may determine the threshold value in case no power failure is detected.

A method may be summarized as including: receiving, by an electrode of an electrostatic charge variation sensor included in a sensor device, a variation of electrostatic charge generated by a power source; generating, by the electrostatic charge variation sensor, an electrostatic charge variation measurement signal of the variation of electrostatic charge; detecting, by a processor included in the sensor device, a power failure of the power source based on the electrostatic charge variation measurement signal and a threshold value; and outputting, by the processor, a power failure flag in response to the power failure being detected.

The method may further include: filtering, by the processor, the electrostatic charge variation measurement signal with a filter; determining, by the processor, an envelope signal of the filtered electrostatic charge variation measurement signal; and detecting, by the processor, the power failure of the power source based on the envelope signal and the threshold value.

The method may further include: filtering, by the processor, the electrostatic charge variation measurement signal with a first filter; determining, by the processor, an absolute signal of the filtered electrostatic charge variation measurement signal; filtering, by the processor, the absolute signal with a second filter different from the first filter; and detecting, by the processor, the power failure of the power source based on the filtered absolute signal and the threshold value.

A device may be summarized as including: an electrostatic charge variation sensor configured to generate an electrostatic charge variation measurement signal that indicates a variation of electrostatic charge generated by a power source; and a processor configured to: detect a power failure of the power source based on the electrostatic charge variation measurement signal; and output a power failure flag indicating the power failure.

The device may further include: a host processor configured to determine a threshold value, the processor configured to detect the power failure based on the electrostatic charge variation measurement signal and the threshold value.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a sensor device including:
      an electrostatic charge variation sensor including an electrode configured to receive a variation of electrostatic charge generated by a power source, the electrostatic charge variation sensor configured to generate an electrostatic charge variation measurement signal of the variation of electrostatic charge; and
      a processor configured to:
         filter the electrostatic charge variation measurement signal with a filter;
         determine an envelope signal of the filtered electrostatic charge variation measurement signal;
         detect a power failure of the power source based on the envelope signal and a threshold value; and
         output a power failure flag in response to the power failure being detected; and
   a host processor communicatively coupled to the sensor device, the host processor configured to determine the threshold value.

2. The device of claim 1 wherein the filter is a high pass filter.

3. The device of claim 1 wherein the processor is configured to detect the power failure of the power source in case an amplitude of the envelope signal is less than the threshold value.

4. The device of claim 1 wherein the host processor is configured to determine the threshold value based on the envelope signal.

5. The device of claim 4 wherein the host processor is configured to determine the threshold value based on a mean and a standard deviation of the envelope signal.

6. The device of claim 4 wherein the host processor is configured to determine the threshold value based on a difference between a mean and a standard deviation of the envelope signal.

7. The device of claim 1 wherein the host processor is configured to:

receive an instruction to determine the threshold value; and determine the threshold value in response to the instruction being received.

8. The device of claim 1 wherein the host processor is configured to transmit an alert to a user or sound an alarm in response to the power failure flag being outputted.

9. The device of claim 1 wherein the host processor determines the threshold value in case no power failure is detected.

10. A method, comprising:

receiving, by an electrode of an electrostatic charge variation sensor included in a sensor device, a variation of electrostatic charge generated by a power source;

generating, by the electrostatic charge variation sensor, an electrostatic charge variation measurement signal of the variation of electrostatic charge;

filtering, by a processor included in the sensor device, the electrostatic charge variation measurement signal with a filter;

determining, by the processor, an envelope signal of the filtered electrostatic charge variation measurement signal;

detecting, by the processor, a power failure of the power source based on the envelope signal and a threshold value; and outputting, by the processor, a power failure flag in response to the power failure being detected.

11. The method of claim 10 wherein the filter is a high pass filter.

12. A device, comprising:

a sensor device including:

an electrostatic charge variation sensor including an electrode configured to receive a variation of electrostatic charge generated by a power source, the electrostatic charge variation sensor configured to generate an electrostatic charge variation measurement signal of the variation of electrostatic charge; and a processor configured to:

filter the electrostatic charge variation measurement signal with a first filter;

determine an absolute signal of the filtered electrostatic charge variation measurement signal;

filter the absolute signal with a second filter different from the first filter; detect a power failure of the power source based on the filtered absolute signal and a threshold value; and output a power failure flag in response to the power failure being detected; and a host processor communicatively coupled to the sensor device, the host processor configured to determine the threshold value.

13. The device of claim 12 wherein the first filter is a high pass filter, and the second filter is a band pass filter.

14. The device of claim 12 wherein the processor is configured to:

detect the power failure of the power source in case an amplitude of the filtered absolute signal is less than the threshold value; and detect no power failure of the power source in case the amplitude of the filtered absolute signal is greater than another threshold value greater than the threshold value.

15. The device of claim 14 wherein the host processor is configured to determine the threshold value and the another threshold value based on the filtered absolute signal.

16. The device of claim 14 wherein the host processor is configured to determine the threshold value based on a difference between a mean and a standard deviation of the filtered absolute signal, and the another threshold value based on a sum of the mean and the standard deviation of the filtered absolute signal.

17. A method, comprising:

receiving, by an electrode of an electrostatic charge variation sensor included in a sensor device, a variation of electrostatic charge generated by a power source;

generating, by the electrostatic charge variation sensor, an electrostatic charge variation measurement signal of the variation of electrostatic charge;

filtering, by a processor included in the sensor device, the electrostatic charge variation measurement signal with a first filter;

determining, by the processor, an absolute signal of the filtered electrostatic charge variation measurement signal;

filtering, by the processor, the absolute signal with a second filter different from the first filter;

detecting, by the processor, a power failure of the power source based on the filtered absolute signal and a threshold value; and outputting, by the processor, a power failure flag in response to the power failure being detected.

18. The method of claim 17 wherein the first filter is a high pass filter, and the second filter is a band pass filter.

* * * * *